United States Patent
Greenstein

(10) Patent No.: US 11,621,476 B2
(45) Date of Patent: *Apr. 4, 2023

(54) ANTENNA ASSEMBLY FOR A VEHICLE WITH SLEEP SENSE COMMAND

(71) Applicant: Airgain, Inc., San Diego, CA (US)

(72) Inventor: Larry Greenstein, San Diego, CA (US)

(73) Assignee: Airgain, Inc., San Diego, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 17/227,307

(22) Filed: Apr. 10, 2021

(65) Prior Publication Data

US 2021/0257724 A1    Aug. 19, 2021

Related U.S. Application Data

(63) Continuation-in-part of application No. 16/847,981, filed on Apr. 14, 2020, now Pat. No. 11,165,132, which is a continuation-in-part of application No. 16/570,448, filed on Sep. 13, 2019, now Pat. No. 10,931,325, which is a continuation-in-part of application No. 16/237,678, filed on Jan. 1, 2019, now Pat. No. 10,511,086.

(60) Provisional application No. 63/009,989, filed on Apr. 14, 2020.

(51) Int. Cl.
*H01Q 1/32* (2006.01)
*H04L 12/12* (2006.01)
*H04B 1/3822* (2015.01)
*H01Q 1/42* (2006.01)

(52) U.S. Cl.
CPC ............. *H01Q 1/3275* (2013.01); *H01Q 1/42* (2013.01); *H04B 1/3822* (2013.01); *H04L 12/12* (2013.01)

(58) Field of Classification Search
CPC ...... H01Q 1/3275; H01Q 1/42; H04B 1/3822; H04L 12/12
See application file for complete search history.

(56) References Cited

U.S. PATENT DOCUMENTS

| D418,142 S | 12/1999 | Thill |
| 6,028,537 A * | 2/2000 | Suman .................. B60K 35/00 |
| | | 340/988 |
| 6,087,990 A | 7/2000 | Thill et al. |
| 6,850,191 B1 | 2/2005 | Thill et al. |
| 7,061,437 B2 | 6/2006 | Lin et al. |

(Continued)

FOREIGN PATENT DOCUMENTS

| WO | WO2004019443 | 3/2004 |
| WO | WO2017076750 | 5/2017 |

OTHER PUBLICATIONS

Intl. Search Report For PCT Application PCT/US2021/026757, dated Jun. 29, 2021.

(Continued)

*Primary Examiner* — James Wu
(74) *Attorney, Agent, or Firm* — Clause Eight; Michael Catania

(57) ABSTRACT

A method and system for activating and deactivating a communication module for an apparatus is disclosed herein. The method includes monitoring a power activity state for the apparatus, monitoring a power activity state for a router for the apparatus, and maintaining an activation state for the communication module as long as the power activity state of the apparatus or the router is active.

13 Claims, 14 Drawing Sheets

(56) References Cited

U.S. PATENT DOCUMENTS

| | | |
|---|---|---|
| 7,148,849 B2 | 12/2006 | Lin |
| 7,215,296 B2 | 5/2007 | Abramov et al. |
| D546,821 S | 7/2007 | Oliver |
| D549,696 S | 8/2007 | Oshima et al. |
| 7,333,067 B2 | 2/2008 | Hung et al. |
| 7,336,959 B2 | 2/2008 | Khitrik et al. |
| D573,589 S | 7/2008 | Montgomery et al. |
| 7,405,704 B1 | 8/2008 | Lin et al. |
| 7,477,195 B2 | 1/2009 | Vance |
| 7,512,413 B2 | 3/2009 | Hui et al. |
| D592,195 S | 5/2009 | Wu et al. |
| 7,570,215 B2 | 8/2009 | Abramov et al. |
| D599,334 S | 9/2009 | Chiang |
| D606,053 S | 12/2009 | Wu et al. |
| D607,442 S | 1/2010 | Su et al. |
| D608,769 S | 1/2010 | Bufe |
| D612,368 S | 3/2010 | Yang et al. |
| 7,705,783 B2 | 4/2010 | Rao et al. |
| 7,729,662 B2 | 6/2010 | Abramov et al. |
| D621,819 S | 8/2010 | Tsai et al. |
| 7,843,390 B2 | 11/2010 | Liu |
| D633,483 S | 3/2011 | Su et al. |
| D635,127 S | 3/2011 | Tsai et al. |
| 7,907,971 B2 | 3/2011 | Salo et al. |
| D635,560 S | 4/2011 | Tsai et al. |
| D635,963 S | 4/2011 | Podduturi |
| D635,964 S | 4/2011 | Podduturi |
| D635,965 S | 4/2011 | Mi et al. |
| D636,382 S | 4/2011 | Podduturi |
| 7,965,242 B2 | 6/2011 | Abramov et al. |
| D649,962 S | 12/2011 | Tseng et al. |
| D651,198 S | 12/2011 | Mi et al. |
| D654,059 S | 2/2012 | Mi et al. |
| D654,060 S | 2/2012 | Ko et al. |
| D658,639 S | 5/2012 | Huang et al. |
| D659,129 S | 5/2012 | Mi et al. |
| D659,685 S | 5/2012 | Huang et al. |
| D659,688 S | 5/2012 | Huang et al. |
| 8,175,036 B2 | 5/2012 | Visuri et al. |
| 8,184,601 B2 | 5/2012 | Abramov et al. |
| D662,916 S | 7/2012 | Huang et al. |
| 8,248,970 B2 | 8/2012 | Abramov et al. |
| D671,097 S | 11/2012 | Mi et al. |
| 8,310,402 B2 | 11/2012 | Yang |
| D676,429 S | 2/2013 | Gosalia et al. |
| D678,255 S | 3/2013 | Ko et al. |
| 8,423,084 B2 | 4/2013 | Abramov et al. |
| D684,565 S | 6/2013 | Wei |
| D685,352 S | 7/2013 | Wei |
| D685,772 S | 7/2013 | Zheng et al. |
| D686,600 S | 7/2013 | Yang |
| D689,474 S | 9/2013 | Yang et al. |
| D692,870 S | 11/2013 | He |
| D694,738 S | 12/2013 | Yang |
| D695,279 S | 12/2013 | Yang et al. |
| D695,280 S | 12/2013 | Yang et al. |
| 8,654,030 B1 | 2/2014 | Mercer |
| 8,669,903 B2 | 3/2014 | Thill et al. |
| D703,195 S | 4/2014 | Zheng |
| D703,196 S | 4/2014 | Zheng |
| D706,247 S | 6/2014 | Zheng et al. |
| D706,750 S | 6/2014 | Bringuir |
| D706,751 S | 6/2014 | Chang et al. |
| D708,602 S | 7/2014 | Gosalia et al. |
| D709,053 S | 7/2014 | Chang et al. |
| D710,832 S | 8/2014 | Yang |
| D710,833 S | 8/2014 | Zheng et al. |
| 8,854,265 B1 | 10/2014 | Yang et al. |
| D716,775 S | 11/2014 | Bidermann |
| 9,225,055 B2 * | 12/2015 | Kaneko ............... H01Q 1/3275 |
| 9,432,070 B2 | 8/2016 | Mercer |
| 9,754,431 B2 * | 9/2017 | Sigal ................ G07C 9/00571 |
| 9,912,043 B1 | 3/2018 | Yang |
| D823,285 S | 7/2018 | Montgomery |
| D832,241 S | 10/2018 | He et al. |
| 10,109,918 B2 | 10/2018 | Thill |
| 10,164,324 B1 | 12/2018 | He et al. |
| 10,305,182 B1 | 5/2019 | Iellici |
| 10,511,086 B1 * | 12/2019 | Thill .................... H01Q 1/3275 |
| 10,931,325 B2 * | 2/2021 | Thill .................... H01Q 1/3275 |
| 2002/0003499 A1 | 1/2002 | Kouam et al. |
| 2002/0156576 A1 | 10/2002 | Annett et al. |
| 2004/0222936 A1 | 11/2004 | Hung et al. |
| 2005/0073462 A1 | 4/2005 | Lin et al. |
| 2005/0190108 A1 | 9/2005 | Lin et al. |
| 2006/0208900 A1 | 9/2006 | Tavassoli Hozouri |
| 2007/0030203 A1 | 2/2007 | Tsai et al. |
| 2008/0150829 A1 | 6/2008 | Lin et al. |
| 2009/0002244 A1 | 1/2009 | Woo |
| 2009/0058739 A1 | 3/2009 | Konishi |
| 2009/0135072 A1 | 5/2009 | Ke et al. |
| 2009/0231186 A1 * | 9/2009 | Barak ................ H01Q 21/0025 342/352 |
| 2009/0262028 A1 | 10/2009 | Murnbru et al. |
| 2010/0188297 A1 | 7/2010 | Chen et al. |
| 2010/0283684 A1 | 11/2010 | Rabinovich |
| 2010/0309067 A1 | 12/2010 | Tsou et al. |
| 2011/0006950 A1 | 1/2011 | Park et al. |
| 2012/0038514 A1 | 2/2012 | Bang |
| 2012/0229348 A1 | 9/2012 | Chiang |
| 2012/0242546 A1 | 9/2012 | Hu et al. |
| 2017/0054204 A1 | 2/2017 | Changalvala et al. |
| 2017/0317409 A1 | 11/2017 | Ayatollahi et al. |

OTHER PUBLICATIONS

Office Action for U.S. Appl. No. 16/414,717, dated Jun. 17, 2019.
International Search Report for PCT Application PCT/US2019/061038.

* cited by examiner

1800

Receiving an activation signal at a processor from an ignition input or USB port of a vehicle internal router

1801

Activating the modem from the low power sleep mode

1802

Receiving an input deactivation signal from the ignition input or the USB port voltage of the vehicle internal router and deactivating the modem

1803

ANTENNA ASSEMBLY FOR A VEHICLE WITH SLEEP SENSE COMMAND

CROSS REFERENCES TO RELATED APPLICATIONS

The Present Application claims priority to U.S. Provisional Patent Application No. 63/009,989, filed on Apr. 14, 2020, and is a continuation-in-part of U.S. patent application Ser. No. 16/847,981, filed on Apr. 14, 2020, which is a continuation-in-part application of U.S. patent application Ser. No. 16/570,448, filed on Sep. 13, 2019, now U.S. patent Ser. No. 10/931,325, issued on Feb. 23, 2021, which is a continuation-in-part application of U.S. patent application Ser. No. 16/237,678, filed on Jan. 1, 2019, now U.S. patent Ser. No. 10/511,086, issued on Dec. 17, 2019, each of which is hereby incorporated by reference in its entirety

STATEMENT REGARDING FEDERALLY SPONSORED RESEARCH OR DEVELOPMENT

Not Applicable

BACKGROUND OF THE INVENTION

Field of the Invention

This invention generally relates to a power monitoring system for a communication module, and specifically to a power monitoring system for a communication module for a vehicle.

Description of the Related Art

In wireless communication systems for vehicles, a modem for the vehicle is typically placed a great distance away from an antenna in order to prevent electro-magnetic signals from the modem from interfering with the antenna. This often requires a long coaxial cable wired throughout the vehicle.

General definitions for terms utilized in the pertinent art are set forth below.

BLUETOOTH technology is a standard short range radio link that operates in the unlicensed 2.4 gigahertz band.

Code Division Multiple Access ("CDMA") is a spread spectrum communication system used in second generation and third generation cellular networks, and is described in U.S. Pat. No. 4,901,307.

GSM, Global System for Mobile Communications is a second generation digital cellular network.

The Universal Mobile Telecommunications System ("UMTS") is a wireless standard.

Long Term Evolution ("LTE") is a standard for wireless communication of high-speed data for mobile phones and data terminals and is based on the GSM/EDGE and UMTS/HSPA communication network technologies.

LTE Frequency Bands include 698-798 MHz (Band 12, 13, 14, 17); 791-960 MHz (Band 5, 6, 8, 18, 19, 20); 1710-2170 MHz (Band 1, 2, 3, 4, 9, 10, 23, 25, 33, 34, 35, 36, 37, 39); 1427-1660.5 MH (Band 11, 21, 24); 2300-2700 MHz (Band 7, 38, 40, 41); 3400-3800 MHz (Band 22, 42, 43).

Antenna impedance and the quality of the impedance match are most commonly characterized by either return loss or Voltage Standing Wave Ratio.

Surface Mount Technology ("SMT") is a process for manufacturing electronic circuits wherein the components are mounted or placed directly onto a surface of a printed circuit board ("PCB").

The APPLE IPHONE® 5 LTE Bands include: LTE700/1700/2100 (698-806 MHz/1710-1785 MHz/1920-2170 MHz); LTE 850/1800/2100 (824-894 MHz/1710-1880 MHz/1920-2170 MHz); and LTE 700/850/1800/1900/2100 (698-806 MHz/824-894 MHz/1710-1880 MHz/1850-1990 MHz/1920/2170).

The SAMSUNG GALAXY® SIII LTE Bands include: LTE 800/1800/2600 (806-869 MHz/1710-1880 MHz/2496-2690 MHz.

The NOKIA LUMIA® 920 LTE Bands: LTE 700/1700/2100 (698-806 MHz/1710-1785 MHz/1920-2170 MHz); LTE 800/900/1800/2100/2600 (806-869 MHz/880-960 MHz/1710-1880 MHz/1920-2170 MHz/2496-2690 MHz).

The long coaxial cable that connects a modem to an antenna on a vehicle leads to signal losses due to the length of the coaxial cable. Thus, there is a need for placement of a modem in proximity of an antenna for a vehicle system.

BRIEF SUMMARY OF THE INVENTION

One aspect of the present invention is a method for activating and deactivating a communication module for an apparatus. The method includes monitoring, at the communication module, a power activity state for the apparatus. The method also includes monitoring, at the communication module, a power activity state for a router for the apparatus. The method also includes maintaining an activation state for the communication module as long as the power activity state of the apparatus or the router is active.

The method further includes deactivating the communication module after a predetermined time period from the deactivation of the last to deactivate of the apparatus and the router.

The method further includes reactivating the communication module upon the reactivation of the apparatus or the router for the apparatus.

Another aspect of the present invention is a wireless communication assembly for a vehicle comprising a base, a modem, a top lid, a housing, a router and an edge computing device. The base is composed of an aluminum material and attached to the vehicle. The modem is disposed on the base. The top lid is attached to the base, and the top lid comprises at least one antenna element disposed on an exterior surface. The housing covers the top lid and base. The top lid acts as an electro-magnetic barrier for the modem.

Yet another aspect of the present invention is an antenna assembly comprising a base, a modem, a top lid, a housing and a communication cable. The base is composed of an aluminum material, the base comprising a body, an interior surface, a sidewall and a plurality of heat dissipation elements extending from the interior surface. The modem is disposed within the base and on the plurality of heat dissipation elements. The modem comprises at least one of a communication chip, a GNSS reception component, a security access module or a mobile phone communication component. The top lid comprises at least one antenna element disposed on an exterior surface. The communication cable is connected to the modem at one end and extending to and connected to a vehicle internal router with a vehicle modem at the other end. The top lid and base act as an electro-magnetic barrier for the modem. The connection from the vehicle internal router to the modem by the communication cable allows the vehicle internal modem to operate on a communication protocol of the modem.

Yet another aspect of the present invention is a wireless communication assembly for a vehicle comprising a base, a modem, a top lid, a housing, a vehicle internal router and a communication cable. The base is composed of an aluminum material, the base comprising a body, an interior surface, a sidewall and a plurality of heat dissipation elements extending from the interior surface. The modem is disposed within the base and on the plurality of heat dissipation elements. The modem comprises at least one of a communication chip, a GNSS reception component, a security access module or a mobile phone communication component. The top lid comprises at least one antenna element disposed on an exterior surface. The communication cable is connected to the modem at one end and extending to and connected to a vehicle internal router with a vehicle modem at the other end. The top lid and base act as an electromagnetic barrier for the modem. The connection from the vehicle internal router to the modem by the communication cable allows the vehicle internal modem to operate on a communication protocol of the modem.

The present invention eliminates the signal loss over the cables connecting the modem to the antenna since the modem and antenna are in relative proximity.

The present invention also replaces several coaxial cables with a single cable.

Yet another aspect of the present invention is a method for activating and deactivating a modem for an antenna assembly for a vehicle. The method includes receiving a status signal at a processor for the antenna assembly that a modem of the antenna assembly is in a low power sleep mode. The method also includes receiving an input activation signal at the processor from an ignition input of the vehicle or a router USB port voltage. The method also includes activating the modem from the low power sleep mode.

Having briefly described the present invention, the above and further objects, features and advantages thereof will be recognized by those skilled in the pertinent art from the following detailed description of the invention when taken in conjunction with the accompanying drawings.

DETAILED DESCRIPTION OF THE INVENTION

Figure 1:
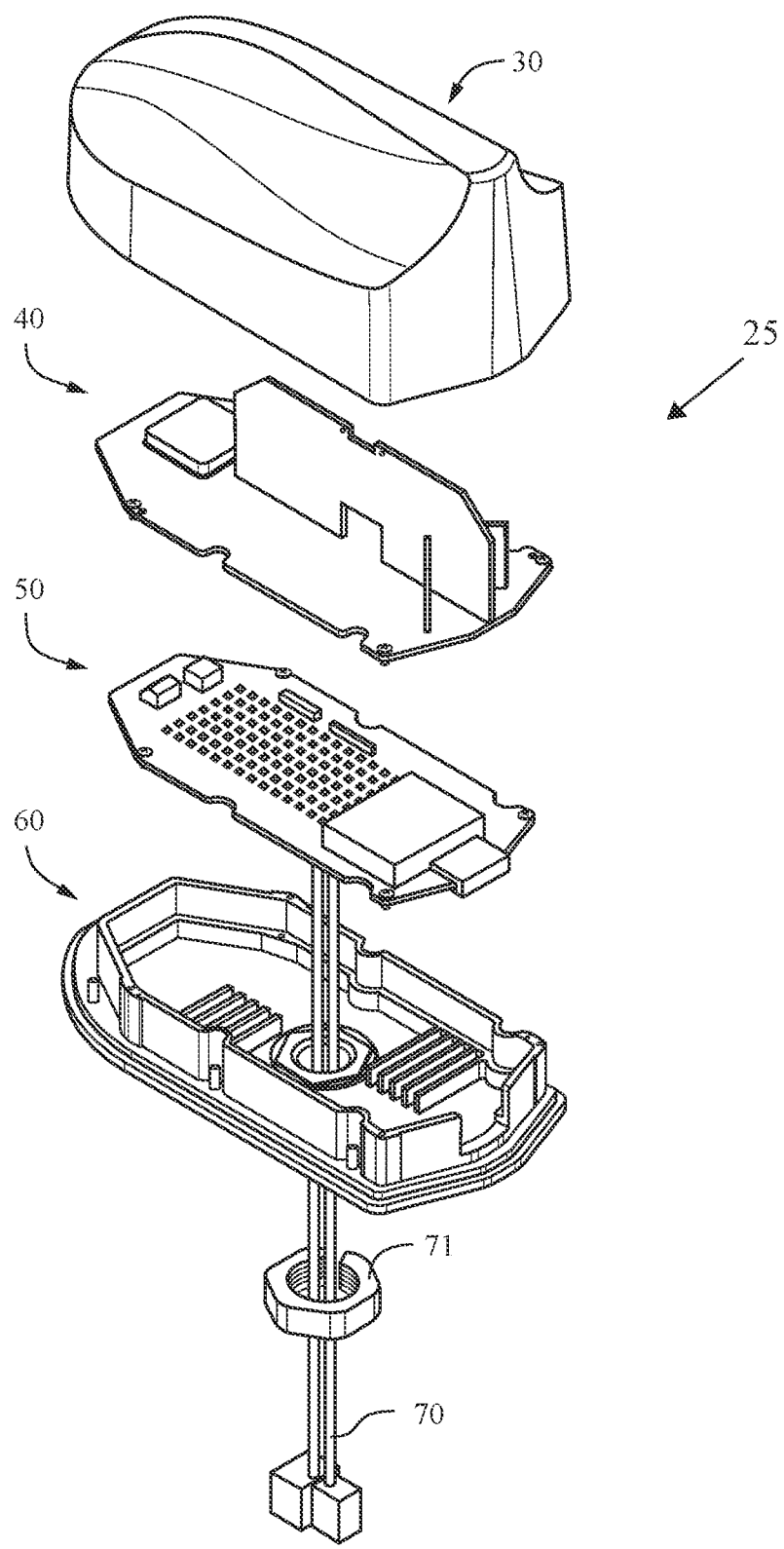
FIG. 1 is an exploded view of an antenna assembly for a vehicle.

An antenna assembly 25 is shown in FIG. 1. The antenna assembly 25 preferably comprises a base 60, a modem 50, a top lid 40 and a housing 30. Alternatively, the antenna assembly comprises a base 60, a modem 50, router (not shown), a top lid 40 and a housing 30. The base 60 is preferably composed of an aluminum material. The modem 50 is disposed on the base 60. The top lid 40 is to cover the base 60 and modem 50, and the top lid 40 preferably comprises at least one antenna element disposed on an exterior surface. A radiofrequency cable 70 is attached to the modem 50 and secured to the base 60 by bolt 71. The housing 30 covers the top lid 40 and the base 60. The top lid 40 acts as an electro-magnetic barrier for the modem 50 to maintain the electro-magnetic signals inside of the base 60 to prevent interference with the antenna signals.

Figure 2:
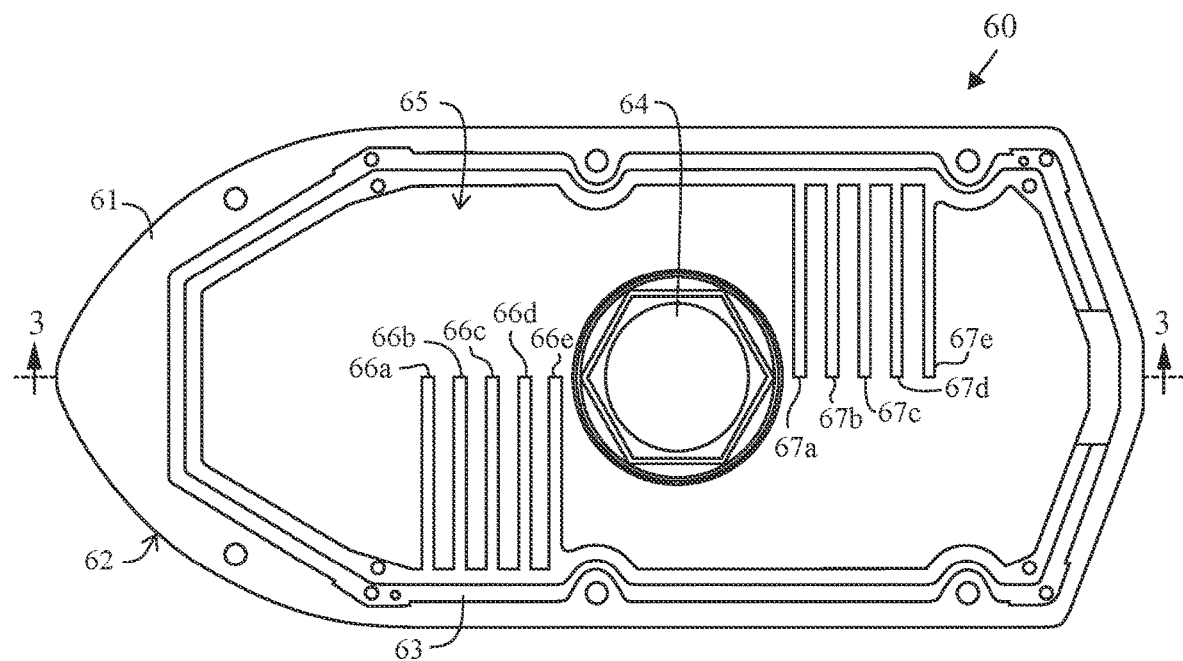
FIG. 2 is a top plan view of a base portion of an antenna assembly for a vehicle.
Figure 3:
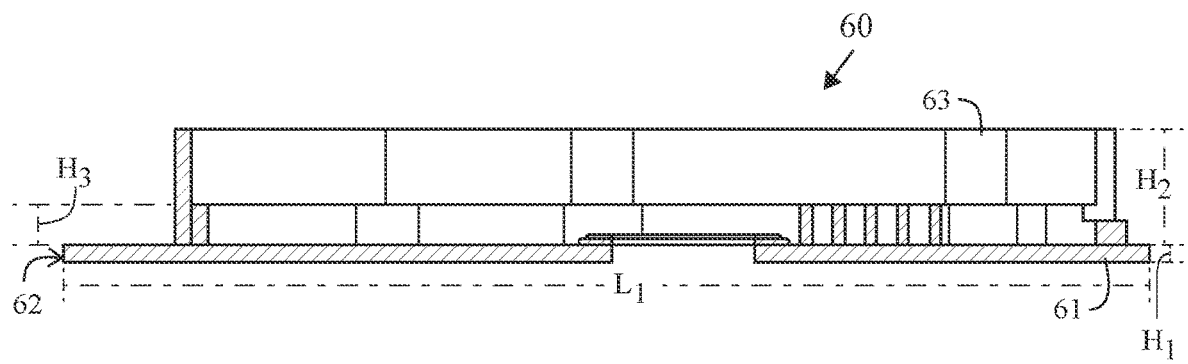
FIG. 3 is a side elevation of the base portion of FIG. 2.

As shown in FIGS. 2 and 3, the base 60 includes a body 61 with an interior surface 62. A side wall 63 defines an interior compartment 65 in which a first plurality of heat dissipation elements 66a-66e and a second plurality of heat dissipation elements 67a-67e. An aperture 64 extends through the body 61 for access by at least one cable. The base 60 is preferably composed of a die-cast aluminum material to prevent electro-magnetic signals from the modem 50 from interfering with the antennas on the top lid 40. In this manner, the modem 50 is capable of being placed in proximity to the antennas on the top lid 50 without interference from electro-magnetic signals with the antennas on the top lid 40.

The first plurality of heat dissipation elements 66a-66e and the second plurality of heat dissipation elements 67a-67e dissipate heat that is generated by the operation of the modem 50.

The sidewall 63, in addition to acting as electro-magnetic barrier, also provides a structure for placement of the top lid 40 thereon.

As shown in FIG. 3, the base 60 preferably has a height H2 ranging from 0.5 inch to 1.0 inch, a height, H1, ranging from 0.05 inch to 0.15 inch, and a height, H3, ranging from 0.15 inch to 0.30 inch The base preferably has a width ranging from 2.5 inches to 3.5 inches, and a length, L1, ranging from 6.0 inches to 8.0 inches. The aperture 64 is preferably from 1.0 inch to 1.25 inches across.

Figure 7:
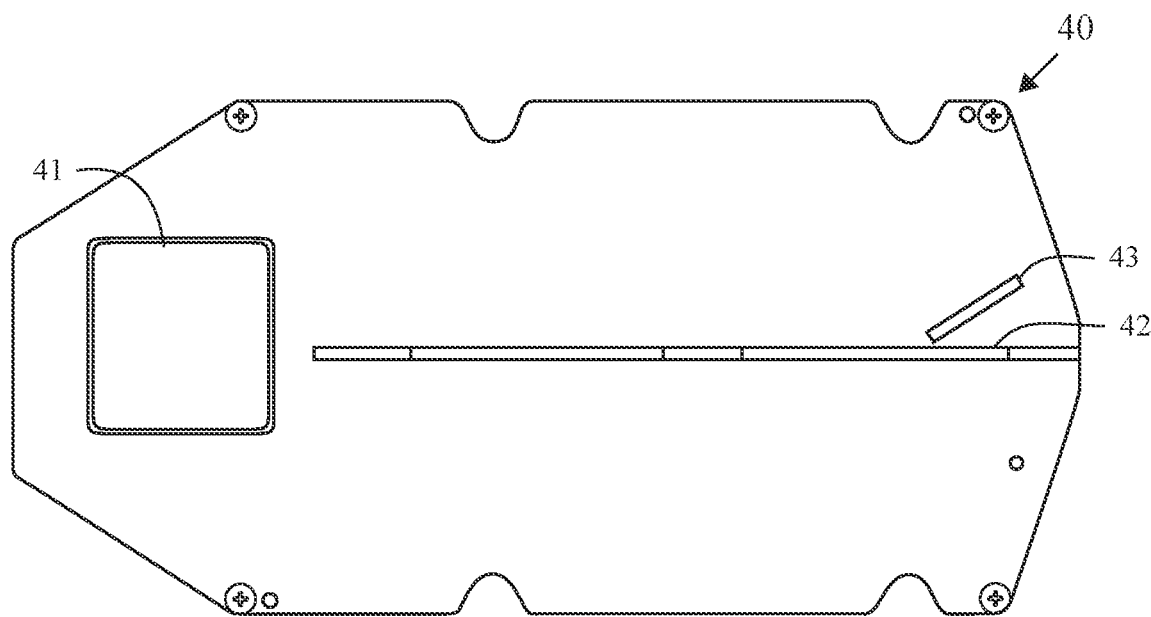
FIG. 7 is a top plan view of a top lid for an antenna assembly for a vehicle.
Figure 8:
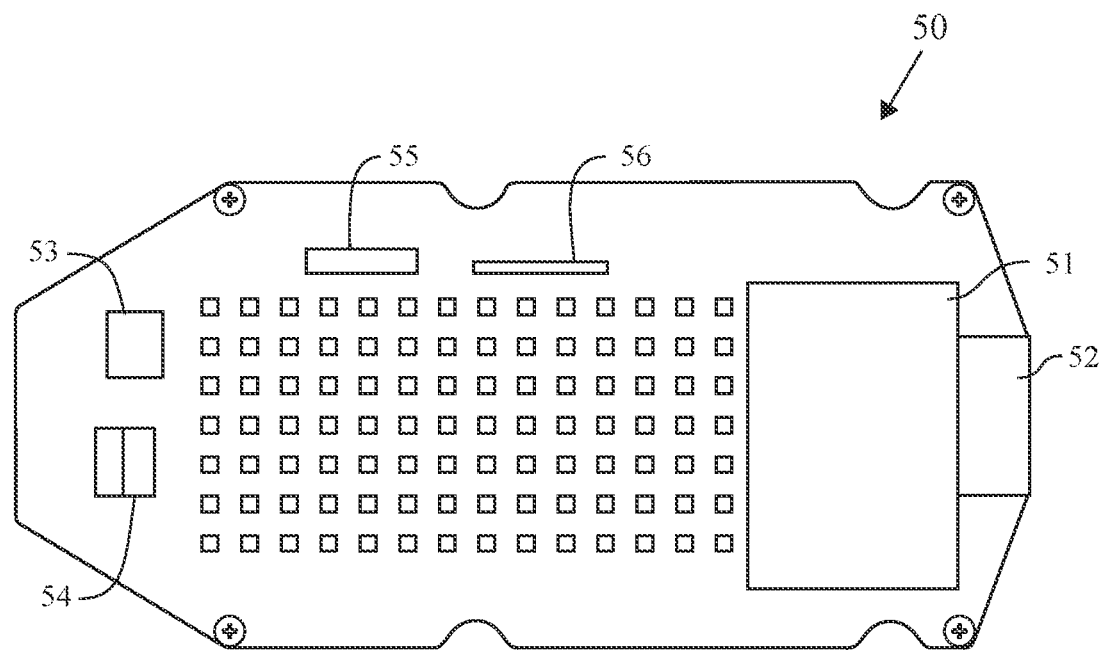
FIG. 8 is a top plan view of a modem for an antenna assembly for a vehicle.

As shown in FIG. 7, the top lid 40 comprises a first antenna element 42, a second antenna element 43 and a third antenna element 41. Preferably the first antenna element 42 is a multi-band antenna for cellular communications such as disclosed in Thill, U.S. patent Ser. No. 10/109,918 for a Multi-Element Antenna For Multiple bands Of Operation And Method Therefor, which is hereby incorporated by reference in its entirety. Alternatively, the first antenna element 42 is a multi-band antenna for cellular communications such as disclosed in He, U.S. Pat. No. 9,362,621 for a Multi-Band LTE Antenna, which is hereby incorporated by reference in its entirety. Alternatively, the first antenna element is a 5G Sub 6 GHz antenna or a mmWave antenna.

Preferably, the second antenna element 43 is selected from the group of antennas consisting of a WiFi 2G antenna, a WiFi 5G antenna, a DECT antenna, a ZigBee antenna, and a Zwave antenna. The WiFi 2G antennas are preferably 2400-2690 MegaHertz. The WiFi 5G antenna is preferably a 5.8 GigaHertz antenna. Alternatively, the second antenna element 43 operates at 5.15 GHz or at 5.85 GHz. Other possible frequencies for the second antenna element 43 include 5150 MHz, 5200 MHz, 5300 MHz, 5400 MHz, 5500 MHz, 5600 MHz, 5700 MHz, 5850 MHz, and 2.4 GHz. The second antenna element 43 preferably operates on an 802.11 communication protocol. Most preferably, the second antenna element 43 operates on an 802.11n communication protocol. Alternatively, the second antenna element 43 operates on an 802.11b communication protocol. Alternatively, the second antenna element 43 operates on an 802.11g communication protocol. Alternatively, the second antenna element 43 operates on an 802.11a communication protocol. Alternatively, the second antenna element 43 operates on an 802.11 ac communication protocol.

The third antenna element 41 is preferably a GPS/GLONASS module.

Those skilled in the pertinent art will recognize that other antenna types may be used for the first antenna element 42, the second antenna element 43 and/or the third antenna element 41 without departing from the scope and spirit of the present invention.

The top lid 40 is preferably composed of an aluminum material, at least on a bottom surface. Alternatively, the top lid 40 is composed of materials that can act as a barrier to electro-magnetic signals.

The modem 50 preferably includes at least one of a computation component, a communication chip 55, a switch, an antenna switch circuit, a GNSS reception component 56, a security access module 53, a mobile phone communication component 54, and a power supply source. The computation component preferably includes a CPU 51, a memory 52, and an interface (I/F) component. The modem 50 preferably operates for cellular protocols including 3G, 4G, 4G HPUE and 5G technology. HPUE is High Power User Equipment, and is more specifically a special class of user equipment for a cellular network, such as a LTE cellular network.

Figure 4:
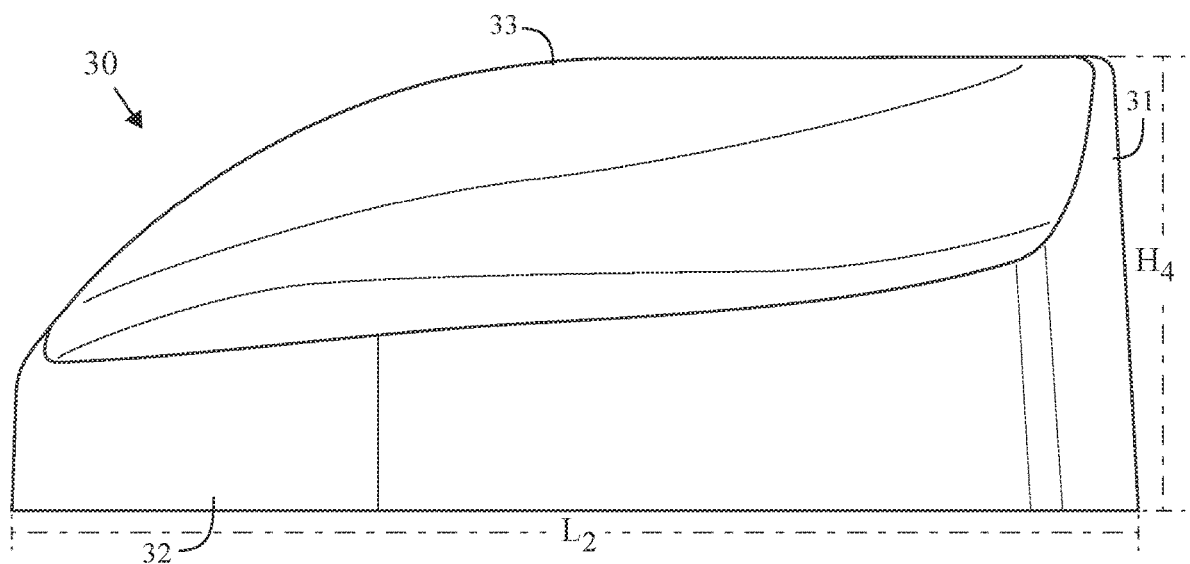
FIG. 4 is a side elevation view of a housing for an antenna assembly for a vehicle.
Figure 5:
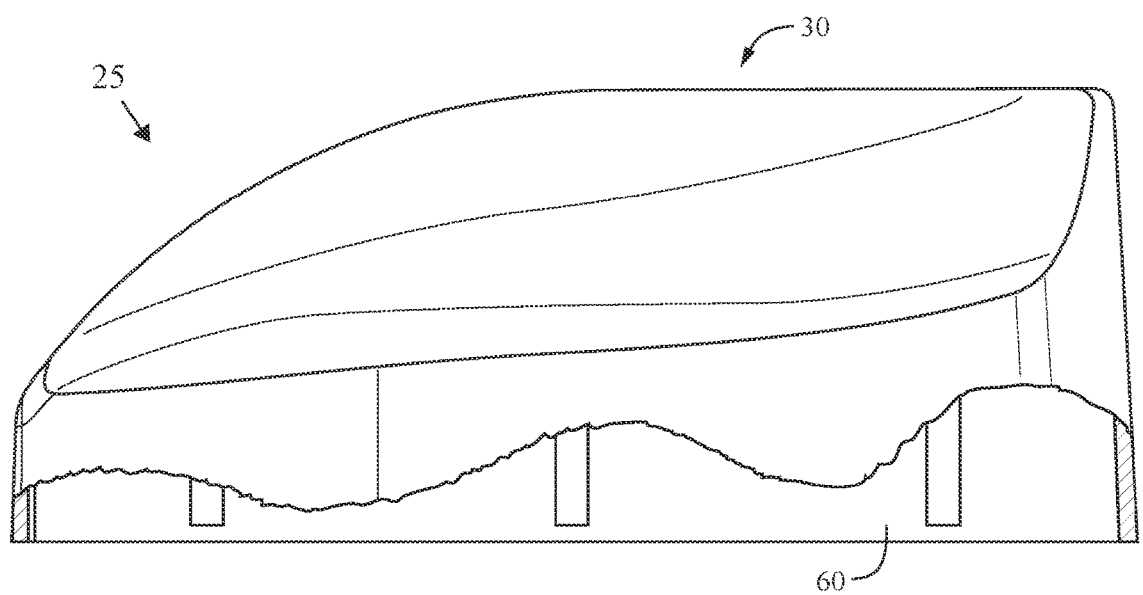
FIG. 5 is a side elevation view of an antenna assembly for a vehicle with a partial cut-away view.
Figure 6:
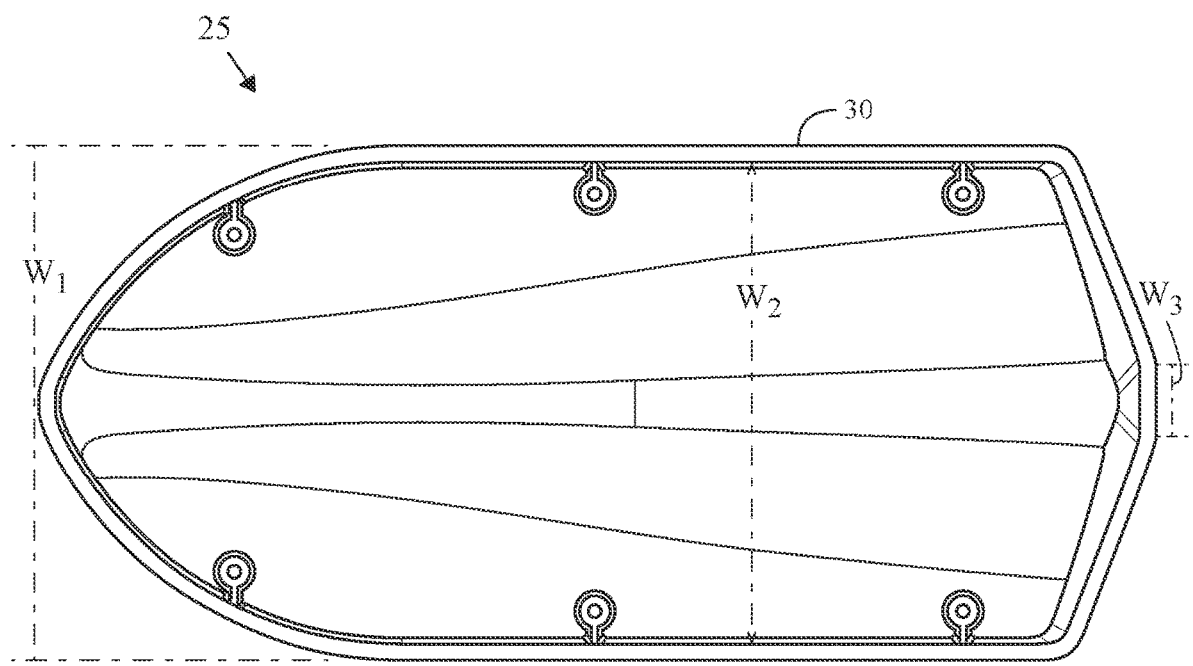
FIG. 6 is a top plan view of an antenna assembly for a vehicle.

Preferably, the housing 30 is composed of a polypropylene material. As shown in FIGS. 4, 5 and 6, the housing 30 preferably has a height, H4, ranging from 50 to 90 millimeters (mm), more preferably from 60 to 80 mm, and most preferably from 65 to 75 mm. The housing 30 preferably has a length, L2, ranging from 100 to 250 mm, more preferably from 150 to 200 mm, and most preferably from 160 to 190 mm. The housing 30 preferably has a width, W1 ranging from 50 to 100 mm, more preferably from 60 to 90 mm, and most preferably from 65 to 85 mm. An internal width W2 is preferably 70 to 80 mm. A width W3 is preferably 10 to 15 mm. The housing 30 has a sidewall 32, a crown 33 and a rear wall 31. The walls of the housing 30 preferably have a thickness ranging from 2 to 7 mm, and most preferably are 5 mm.

Another embodiment of the invention is set forth in FIGS. 9-12. The antenna assembly system is used as a remote modem plus an antenna plus a serial communication system for upgrading existing installed routers to 5G sub 6 GHz, or adding a failover modem. To upgrade an existing router to 5G with a new internal modem, a technician must: remove the router from the vehicle; take the router apart to remove the modem; install a new modem; install the router in the vehicle; and test the router to verify the new modem is working properly.

Figure 9:
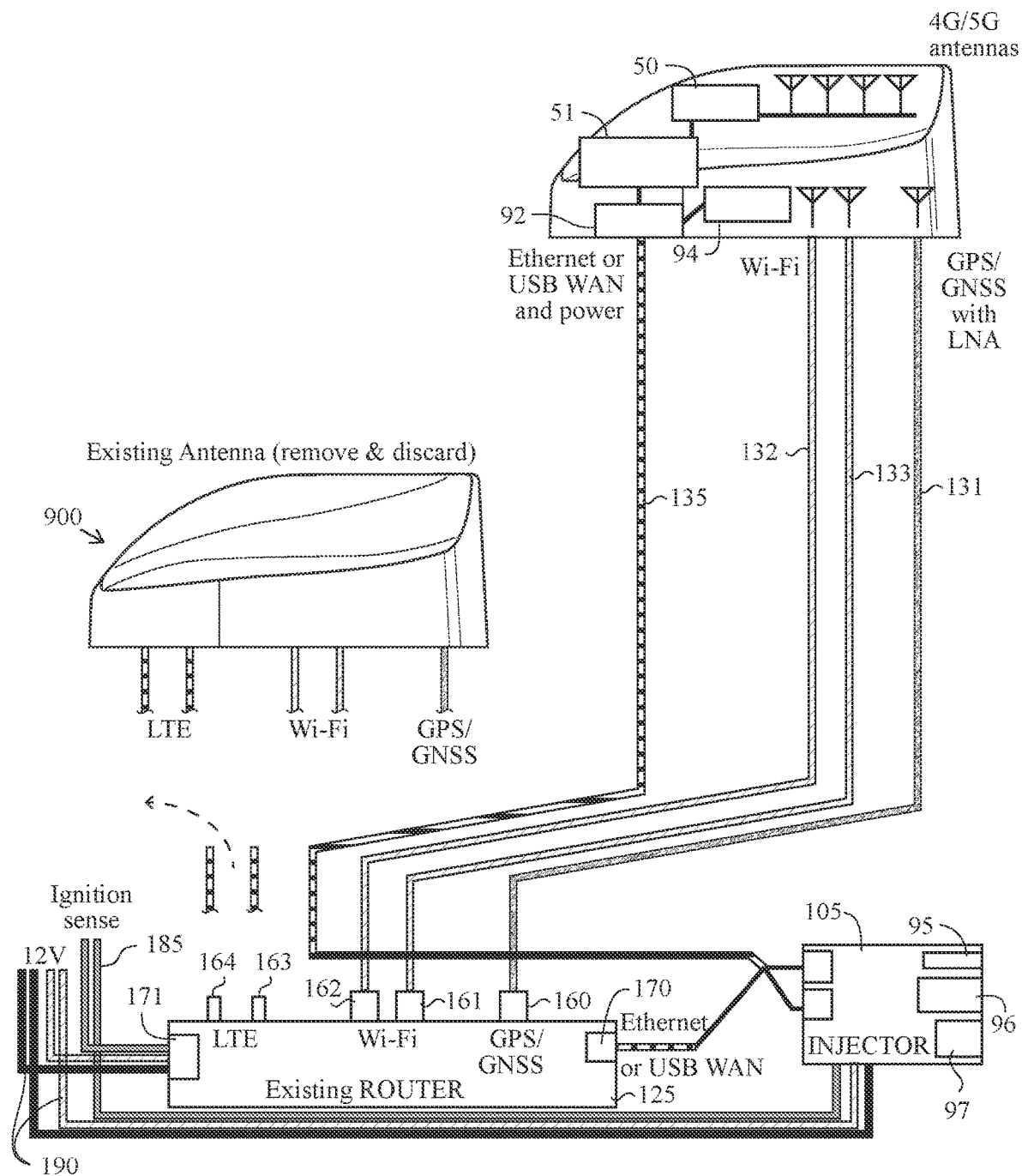
FIG. 9 is block diagram of an antenna assembly connect to an internal modem of a vehicle.

To upgrade an existing router to 5G using an antenna assembly of the present invention, a technician must, leveraging the already-installed coax cables (as shown in FIG. 9): loosen the existing antenna on a vehicle roof, cut the coax cables; add a coax connector to two of the cables; use one coax cable for powering the antenna assembly and for serial Ethernet communications; use the second coax cable for GPS/GNSS; connect a coax-to-Ethernet combiner and power injector to the router's spare Ethernet WAN port to 12V power (it combines Ethernet and power and conveys them over coax) and to an ignition sense; configure the router to use the Ethernet port as the WAN if it is not already configured; test the router to verify it is communicating over the new modem; remove the existing antenna and cables; disconnect the coax cables from the router; remove the antenna from the roof of the vehicle; install the new antenna and connect the coax cables to the router; connect the injector module to the router Ethernet, vehicle power and ignition sense; connect the combiner module Ethernet connector to the router; configure the router to use the Ethernet port as the WAN if it is not already configured; and test the router to verify it is communicating over the new modem.

Figure 10:
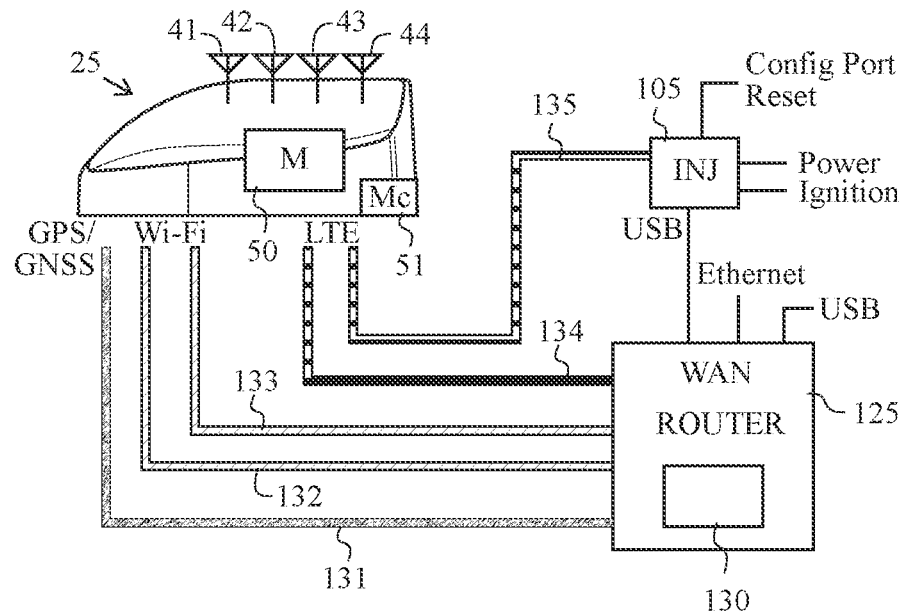
FIG. 10 is block diagram of an antenna assembly connect to an internal modem of a vehicle.
Figure 11:
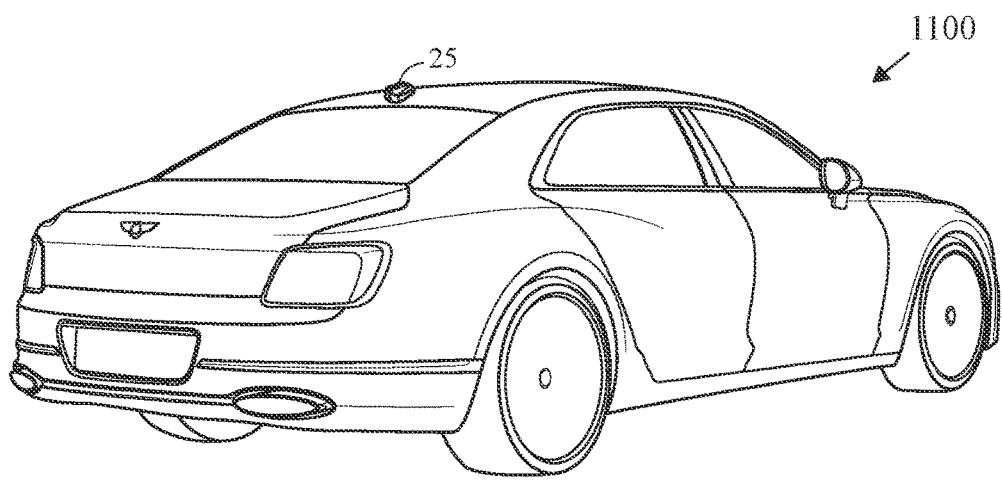
FIG. 11 is an illustration of a vehicle with an antenna assembly.
Figure 12:
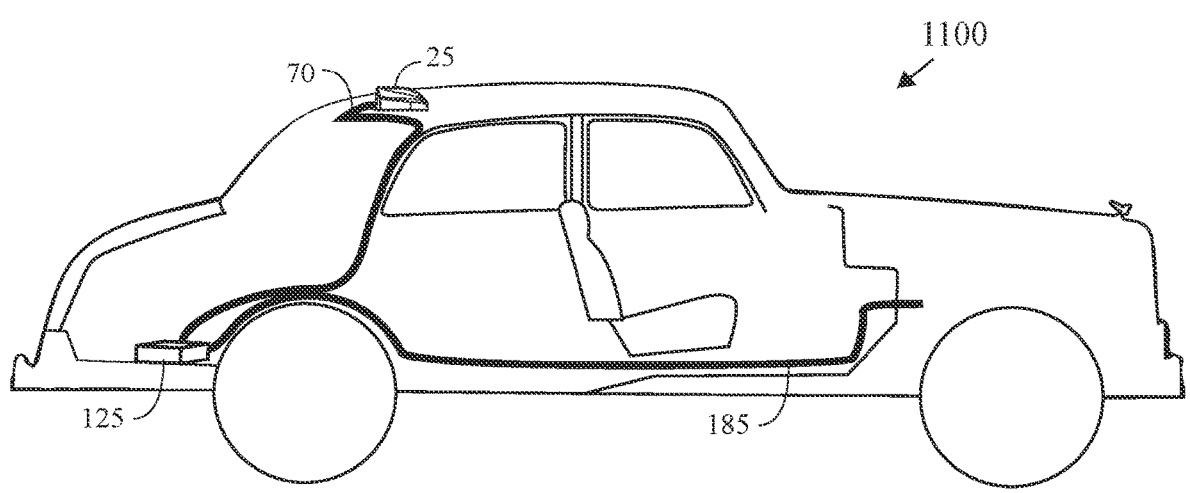
FIG. 12 is an illustration of a vehicle with an antenna assembly connected to an internal modem of a vehicle.

FIG. 9 illustrates the removal of the existing antenna 900 of a vehicle, and the installation of an embodiment of antenna assembly 25 as described herein. FIGS. 10-12 illustrate the connections between the antenna assembly and the existing router 125 of the vehicle 1100. The antenna assembly 25 preferably comprises a base 60, a modem 50, a CPU 51, a combiner 92, a power regulator 94, and a plurality of antenna elements 31, 32, 43 and 44 within a housing 30. Four coaxial cables 131, 132, 133 and 135 are connected from the antenna assembly 25 to connectors on the vehicle. The coaxial cable 135 is connected to an injector 105, the coaxial cables 132 and 133 are connected to WiFi connectors 161 and 162 of a router 125. The coaxial cable 131 is connected to a GPS/GNSS connector 160 of the router 125. The injector 105 comprises a reset button 95, a SIM card 96, a USB connection 97 and a power-conditioning unit. The router 125 preferably comprises a modem 130, an Ethernet or USB WAN connector 170, LTE connectors 163 and 164, an ignition sense and 12 Volt connector 171 which an ignition sense cable 185 and 12 Volt cable 190 connect thereto.

Using certain embodiments described herein, there is no need to remove, open the existing router, remove and replace modem module, close the router, re-install the router, test the router and modem.

Using certain embodiments described herein, installation is quicker and a lower risk (no static discharge accidental damage to the router or modem due to opening the router).

Signal loss is typically higher at 5G mid-band frequencies than traditional cellular, and those losses are mitigated if not eliminated by the present invention. Using the modem that is embedded in the antenna housing avoids cable loss and thereby extends coverage range.

A user of certain embodiments of antenna assemblies described herein can continue to use the software they have been using with their existing router.

The combiner 92 preferably inputs a wide area network connection from the router for send and receive data to/from Internet, and an ignition sense to put the unit to sleep and draw minimal power when the ignition is off. The combiner 92 also inputs twelve volts to power the antenna assembly 25, which allows the combiner 92 to perform power regulation and surge protection, and pass the power up to the modem 50 in the antenna housing 60. The combiner 92 also inputs a SIM card for a carrier (AT&T, Verizon, etc.) subscriber identity module remoted from the modem 50 so that it can be easily accessed in the trunk of the vehicle 1100. All of the above are combined and sent up to the antenna assembly 25 over the existing coaxial cable, or over the Ethernet plus other wires.

Figure 13:
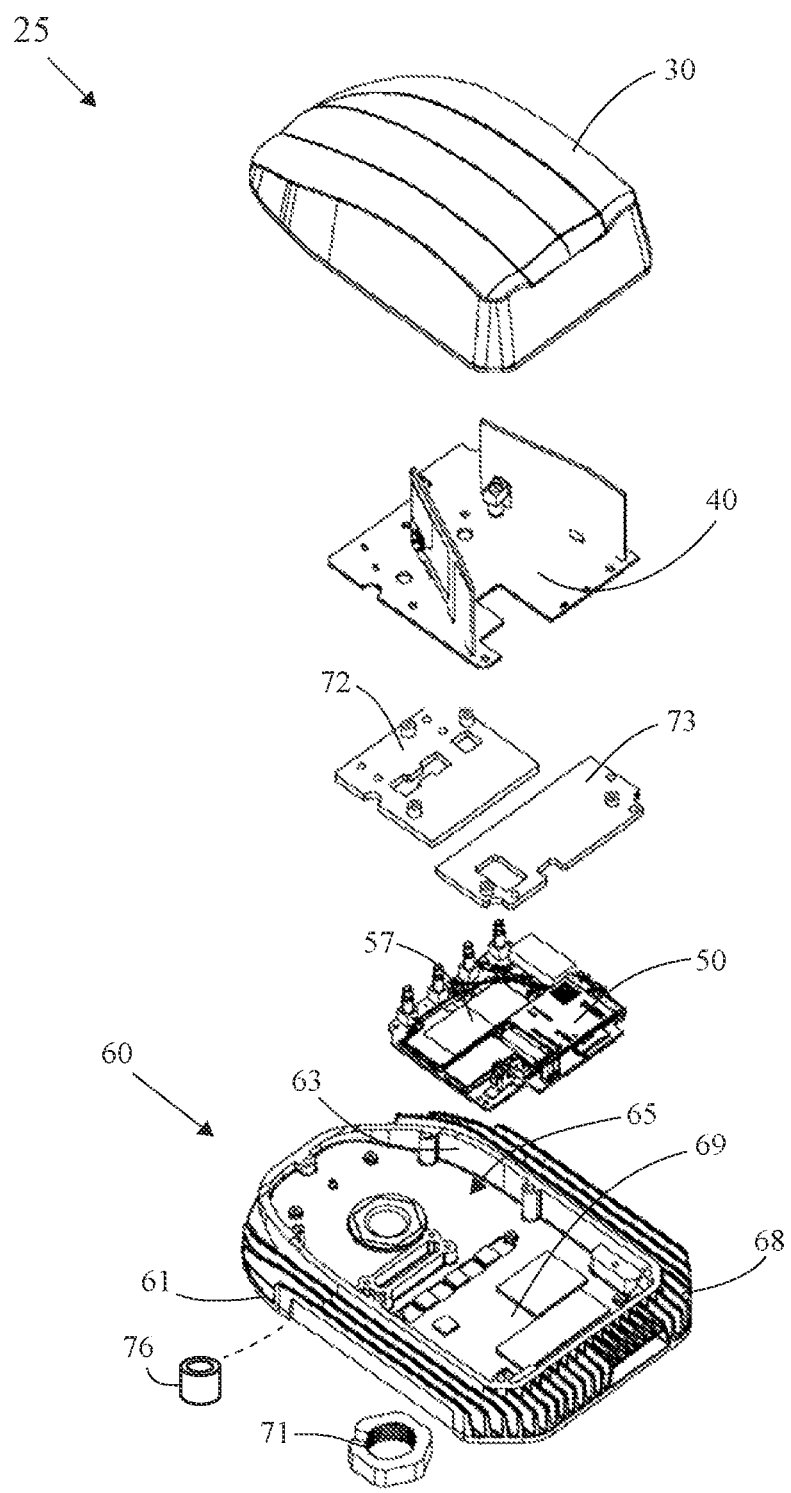
FIG. 13 is an exploded view of an antenna assembly for a vehicle.
Figure 14:
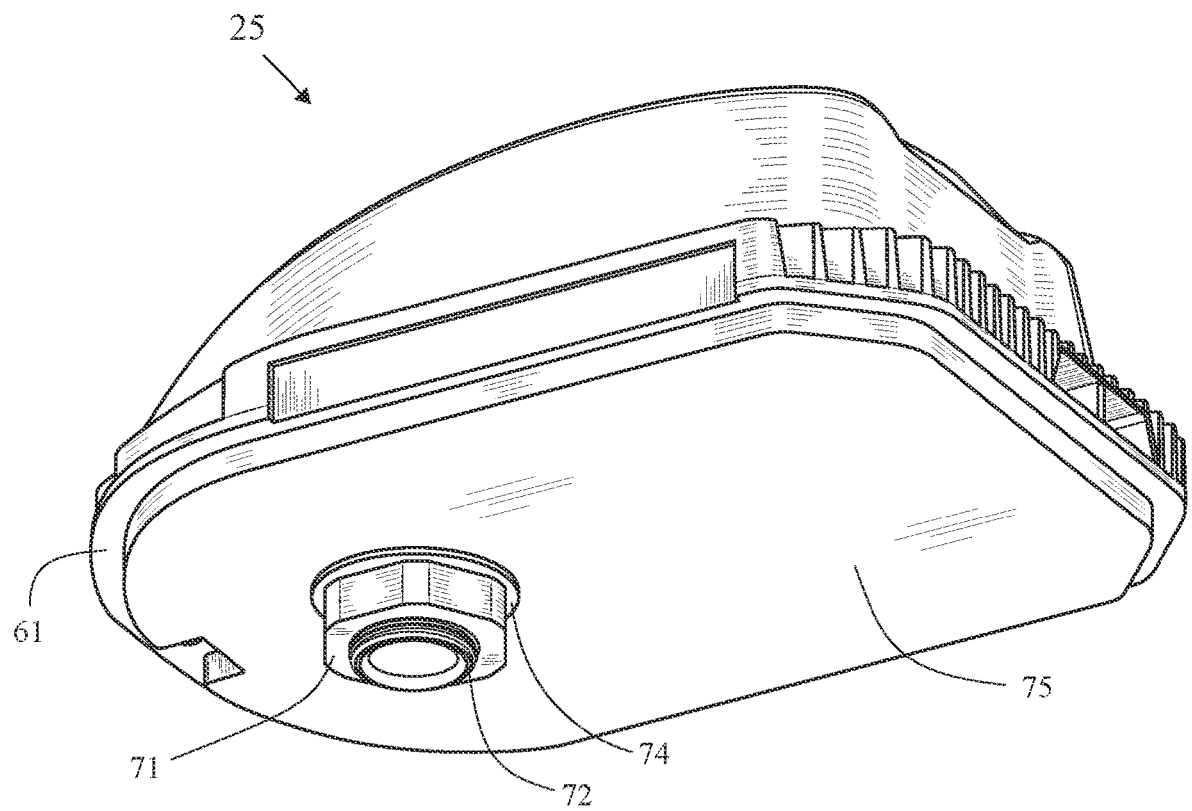
FIG. 14 is a perspective view of an antenna assembly for a vehicle.

FIGS. 13 and 14 illustrate thermal dissipation and isolation features that are utilized in certain embodiments of an antenna assembly 25 for a vehicle to optimize heat removal and to protect certain heat sensitive components. The antenna assembly 25 preferably comprises a housing 30, a top lid 40 with antenna elements and a base 60. The base 60 preferably has a body 61 and a heat sink 68, but those skilled in the pertinent art will recognize that the base may take various other forms without departing from the scope and spirit of the present invention. The body 61 preferably has a structure that forms a mounting surface 65 for some, or all, of the rest of the components of the antenna assembly 25. In some embodiments, the body 61 has an internal compartment or recess 65 forming a mounting surface 69 for mounting certain components directly on the body 61 itself, while other components are mounted on other features that themselves are mounted to the body 61. In certain embodiments having a recess 65 formed by a sidewall 63, the recess 65 has a shape that allows components to be mounted in proximity to or in contact with the heat sink 68. In yet other embodiments, the recess 65 is formed in a shape that allows components to contact the heat sink 68 in substantially different areas, thereby transmitting their respective generated heat to different parts of the heat sink 68, and minimizing the crossflow of heat from one component to another through the heat sink 68. For example, a first area of the heat sink 68 is located on one side of the base 60 and a second area of the heat sink 68 is located on an opposing side of the base 60. Alternatively, a first area of the heat sink 68 is located on one side of the base 60, a second area of the heat sink 68 is located on an opposing side of the base 60, and a third area of the heat sink 68 is located at a rear section of the base 60. Those skilled in the pertinent art will recognize that the heat sink 68 may be partitioned into multiple areas without departing from the scope and spirit of the present invention. The heat sink 68 preferably comprises a plurality of heat dissipation elements. The heat dissipation elements are preferably fins or pins. In some embodiments, the recess 65 is generally rectangular and has mounting surfaces such that one component is in contact with one side of the heat sink 68 formed by the recess 65 and heat from another component is directed to another side of the heat sink 68 formed by the recess. The component mounting surface 69 is preferably formed to mount multiple components that have different heat sensitivities and heat generating characteristics. For example, a first component, such as a modem 50, has a high heat sensitivity and lower heat generation and a second component, such as a high-power amplifier 57, has a lower heat sensitivity, but a much higher heat generation characteristic. Those of skill in the art will know that for different components, different heat sensitivities and different heat generating characteristics may apply and may require further heat dissipation features. In some embodiments, to increase the flow of heat from the components mounted on the base 60, heat transfer plates 72, 73 are attached to the body 61 or heat sink 68 and in thermal contact with the components mounted on the body 61. The heat transfer plates 72, 73 are preferably mounted directly on the components (e.g. modem 50 and high-power amplifier 57) or alternatively in thermal contact with the components via a thermally conductive compound or material. The heat transfer plates 72, 73 of in these embodiments are mounted directly or via fasteners to the body 61 or the heat sink 68. In a preferred embodiment, the first and second heat transfer plates are each made of material selected from the list consisting of copper, aluminum, graphite, carbon diamond, magnesium, gold, silver, aluminum nitride, silicon carbide, and zinc. To provide additional thermal insulation between the components mounted to the body 61, slots (not shown) are formed by molding, cutting or otherwise in the mounting surface 69, to impede the flow of heat from one component to another and encourage the heat flow through the heat sink 68.

In other embodiments, further thermal insulation of the antenna assembly 25 from the vehicle 1100 is desired to prevent heat from the vehicle 1100 from transferring to the antenna assembly 25. In these embodiments, each interface between the antenna assembly 25 and the vehicle 1100 is evaluated for thermal insulation. In these embodiments, a thermally insulative pad 75 is added between the base 61 to reduce heat transmitted from the vehicle 1100 to the antenna assembly 25. In alternative embodiments, the thermally insulative pad 75 is also water resistant to aid in the prevention of water intrusion around and under the antenna assembly 25. In alternative embodiments, a thermally insulative washer 74 is installed between the mounting nut 71 and the vehicle 1100. In other embodiments, a thermally insulative bushing 76, or other thermally insulating part, is installed between the threaded tube 72, through which the radiofrequency cable 70 is routed, that fastens with the mounting nut 71 and the vehicle 1100 to avoid heat transfer from the vehicle 1100.

Figure 15:
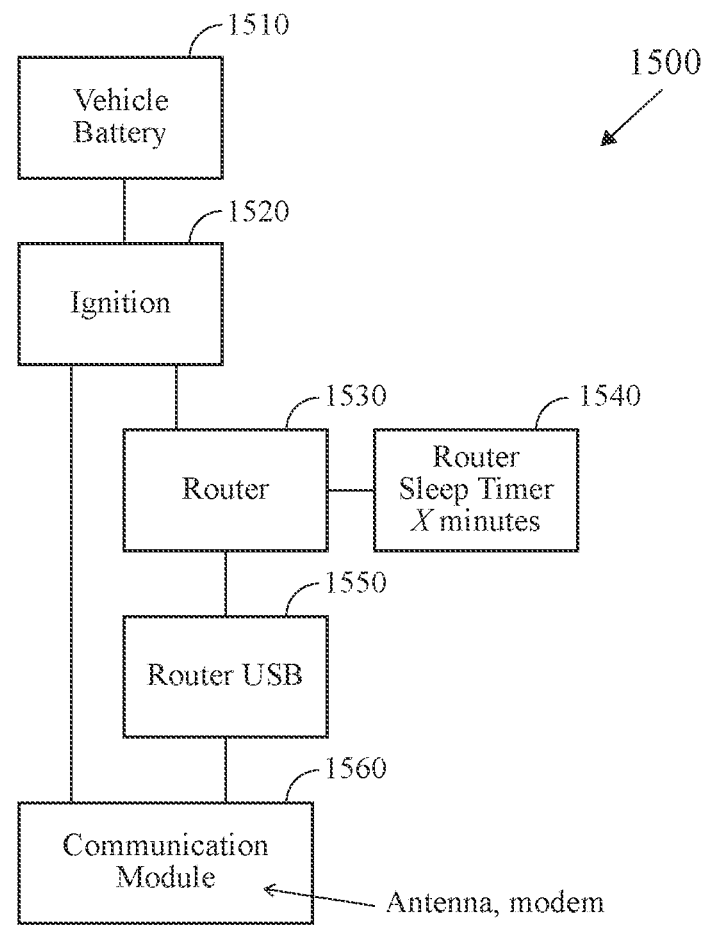
FIG. 15 is a block diagram of a system for activating and deactivating a communication module for an apparatus.
Figure 16:
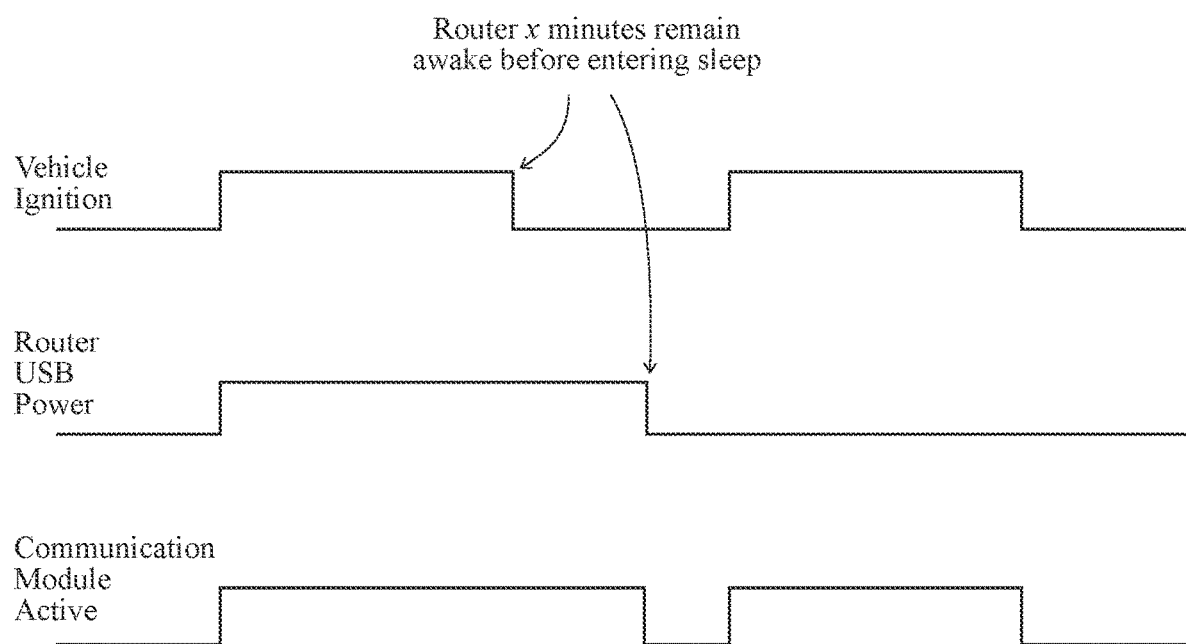
FIG. 16 is a time sequence diagram for a method for activating and deactivating a communication module for an apparatus.

As shown in FIG. 15, a preferred embodiment of a system 1500 for activating and deactivating a communication module for an apparatus is utilized with a vehicle. However, those skilled in the pertinent art will recognize that the system (1500) may be utilized with a vessel, a train, an airplane, an appliance, portable electronic device, or the like, without departing from the scope and spirit of the present invention. The system 1500 includes battery 1510 (which can be any other type of power source), an ignition 1520 (or "on", or power switch), a router 1530, a router sleep timer 1540, a router USB 1550 (or other communications port or connection), and a communication module 1560. The communication module 1560 preferably comprises one or more of the components of the antenna assemblies 25 in embodiments previously described herein. As shown in FIG. 16, the communication module 1560 activates and deactivates in relation to a power activity of the vehicle ignition 1520 and router 1530.

In one embodiment, the communication module 1560 receives vehicle power and ignition 1510 inputs. The power is obvious in purpose. The ignition 1520 input wakes the communication module 1560 from a low power sleep mode so that it does not drain the vehicle when the ignition 1520 is off. Another input to the communication module 1560 connects to the vehicle router 1530 (such as via the +5Vdc pin) on the vehicle router's 1530 USB connector 1550. The normal function of the USB port 1550 on the router 1530 is to connect an accessory like an external modem (not separately shown). Present embodiments use the USB port 1550 to sense when the router 1530 is asleep or awake. The communication module 1560 logically utilizes an "OR" function for comparing router 1530 sleep sense with ignition 1520 sense. The output of the OR controls when the communication module 1560 sleeps (deactivates). If the ignition 1520 is on or the router 1530 is on, the communication module 1560 is on.

The router 1530 is configured to enter sleep mode after a predetermined time period after the ignition 1520 sense goes off. In one embodiment, the system 1500 matches the communication module's 1560 sleep pattern to the router's 1530 sleep pattern, in yet another embodiment, the communication module's 1560 sleep pattern overlaps the router's 1530 sleep pattern to extend beyond the period of the router's 1530 sleep setting timeout to ensure the communication module 1560 remains active beyond the period at which router 1530 powers down.

While the router 1530 is powered up its USB port 1550 provides power out. By sensing the USB port 1550 power, the communication module 1560 determines if the router 1530 is powered up (awake) or powered down.

The communication module 1560 senses the USB port 1550 power to make a determination when to power down (sleep). If the ignition 1520 is off and the USB port 1550 transitions from powered up to powered down, the communication module 1560 will power down (sleep). Any time the USB port 1550 is powered up, the communication module 1560 is powered up. By following the router's 1530 sleep state, the communication module 1560 provides mobile network connectivity whenever the router 1530 needs it. The communication module 1560 similarly senses the vehicle ignition 1520 state. Anytime the ignition 1520 is on, the communication module 1560 is on. By powering up immediately upon the vehicle ignition 1520 coming on, the communication module 1560 rapidly awakens and goes into service before the router 1530 awakens. This enables the router 1530 to immediately connect via the communication module 1560, rather than attempting to use an alternative path to connect to the mobile network. This is logically an OR function. If either the router USB port 1550 is powered on, OR the vehicle ignition 1520 is powered on, then the communication module 1560 is powered up and awake.

Figure 17:
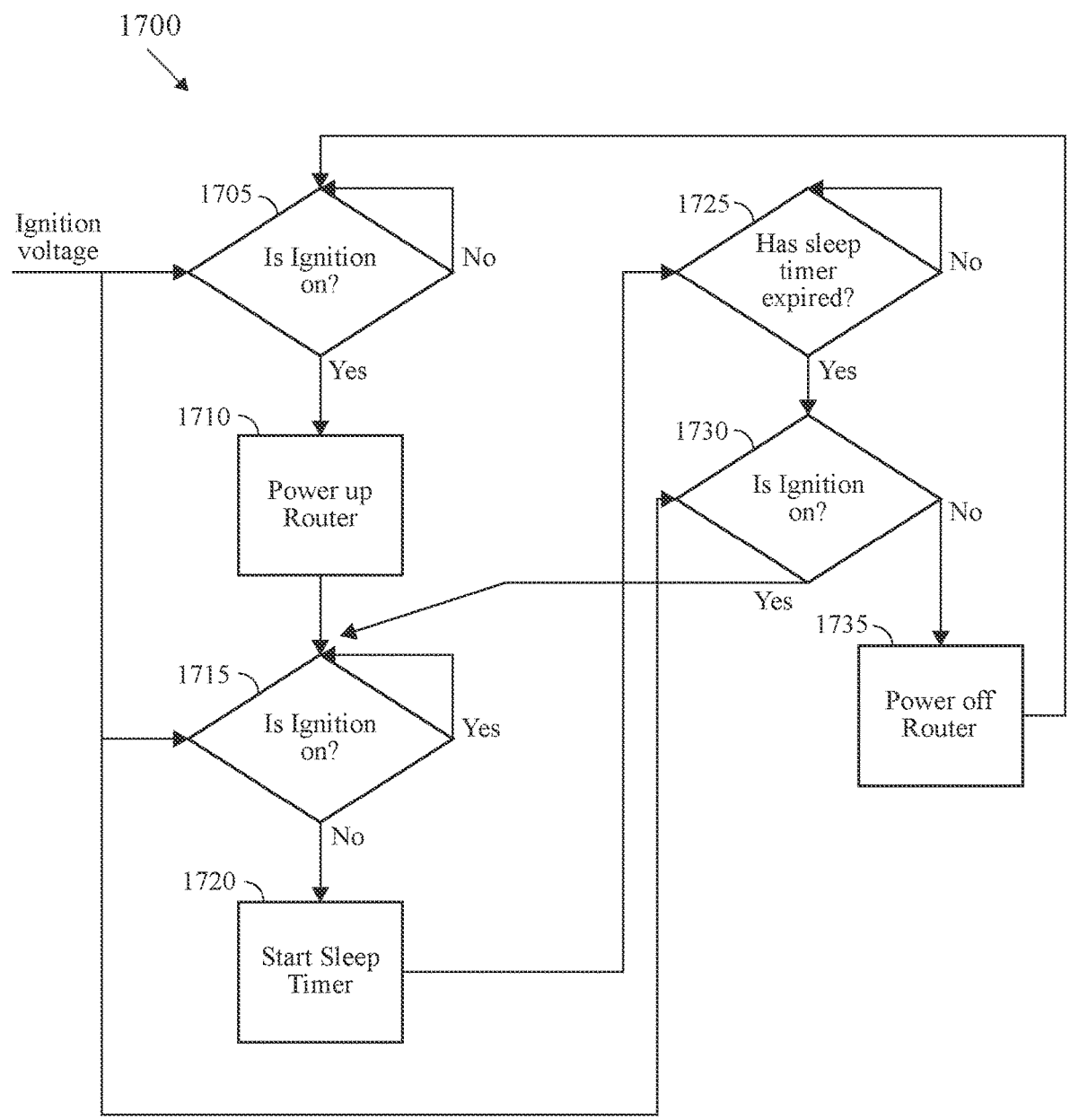
FIG. 17 is a flow chart for a process for a router sleep timer.
Figure 18:
FIG. 18 is a flow chart of a method for activating and deactivating a modem for an antenna assembly for a vehicle.

FIG. 17 is a flow chart for a process 1700 for activating and deactivating a communication module 1560 in a communication system 1500 utilizing a router 1530 sleep timer. At decision state 1705, an inquiry is made if the ignition 1520 is on. If Yes, the process 1700 moves to process state 1710 the router 1530 is powered up. At decision state 1715, an inquiry is made if the ignition 1520 is on. If No, the process 1700 proceeds to process state 1720 and the start sleep timer commences. At decision state 1725, an inquiry is made if the sleep time has expired. If Yes, the process 1500 moves to decision state 1730 where an inquiry is made if the ignition 1520 is on. If No, at the process 1700 proceeds to process state 1735, and the router 1530 is powered off. FIG. 18 illustrates a flow chart for a method 1800 for activating and deactivating a modem for an antenna assembly for a vehicle. At block 1801, an activation signal is received at a processor from an ignition input of the vehicle or a universal serial bus (USB) port voltage of a vehicle internal router when a modem of the antenna assembly is in a low power sleep mode. At block 1802, the modem is activated from the low power sleep mode. At block 1803, an input deactivation signal is received at the processor from the ignition input of the vehicle or the USB port voltage of the vehicle internal router, and the modem is deactivated into the low power sleep mode.

He, U.S. Pat. No. 9,362,621 for a Multi-Band LTE Antenna is hereby incorporated by reference in its entirety.

Abramov et al., U.S. Pat. No. 7,215,296 for a Switch Multi-Beam Antenna Serial is hereby incorporated by reference in its entirety.

Salo et al., U.S. Pat. No. 7,907,971 for an Optimized Directional Antenna System is hereby incorporated by reference in its entirety.

Abramov et al., U.S. Pat. No. 7,570,215 for an Antenna device with a controlled directional pattern and a planar directional antenna is hereby incorporated by reference in its entirety.

Abramov et al., U.S. Pat. No. 8,423,084 for a Method for radio communication in a wireless local area network and transceiving device is hereby incorporated by reference in its entirety.

Khitrik et al., U.S. Pat. No. 7,336,959 for an Information transmission method for a wireless local network is hereby incorporated by reference in its entirety.

Khitrik et al., U.S. Pat. No. 7,043,252 for an Information transmission method for a wireless local network is hereby incorporated by reference in its entirety.

Abramov et al., U.S. Pat. No. 8,184,601 for a METHOD FOR RADIO COMMUNICATION IN A WIRELESS LOCAL AREA NETWORK WIRELESS LOCAL AREA NETWORK AND TRANSCEIVING DEVICE is hereby incorporated by reference in its entirety.

Abramov et al., U.S. Pat. No. 7,627,300 for a Dynamically optimized smart antenna system is hereby incorporated by reference in its entirety.

Abramov et al., U.S. Pat. No. 6,486,832 for a Direction-agile antenna system for wireless communications is hereby incorporated by reference in its entirety.

Yang, U.S. Pat. No. 8,081,123 for a COMPACT MULTI-LEVEL ANTENNA WITH PHASE SHIFT is hereby incorporated by reference in its entirety.

Nagaev et al., U.S. Pat. No. 7,292,201 for a Directional antenna system with multi-use elements is hereby incorporated by reference in its entirety.

Abramov et al., U.S. Pat. No. 7,696,948 for a Configurable directional antenna is hereby incorporated by reference in its entirety.

Abramov et al., U.S. Pat. No. 7,965,242 for a Dual-band antenna is hereby incorporated by reference in its entirety.

Abramov et al., U.S. Pat. No. 7,729,662 for a Radio communication method in a wireless local network is hereby incorporated by reference in its entirety.

Abramov et al., U.S. Pat. No. 8,248,970 for an OPTIMIZED DIRECTIONAL MIMO ANTENNA SYSTEM is hereby incorporated by reference in its entirety.

Visuri et al., U.S. Pat. No. 8,175,036 for a MULTIMEDIA WIRELESS DISTRIBUTION SYSTEMS AND METHODS is hereby incorporated by reference in its entirety.

Yang, U.S. Patent Publication Number 20110235755 for an MIMO Radio System With Antenna Signal Combiner is hereby incorporated by reference in its entirety.

Yang et al., U.S. Pat. No. 9,013,355 for an L SHAPED FEED AS PART OF A MATCHING NETWORK FOR A MICROSTRIP ANTENNA is hereby incorporated by reference in its entirety.

From the foregoing it is believed that those skilled in the pertinent art will recognize the meritorious advancement of this invention and will readily understand that while the present invention has been described in association with a preferred embodiment thereof, and other embodiments illustrated in the accompanying drawings, numerous changes modification and substitutions of equivalents may be made therein without departing from the spirit and scope of this invention which is intended to be unlimited by the foregoing except as may appear in the following appended claim. Therefore, the embodiments of the invention in which an exclusive property or privilege is claimed are defined in the following appended claims.

I claim:

1. An antenna assembly for a vehicle, the antenna assembly comprising:
a base comprising an interior surface, a sidewall and a plurality of heat dissipation elements outward from the sidewall;
a modem disposed within the base;
an antenna board disposed within the base and comprising a plurality of antenna elements;
a housing for covering the base; and
a sleep sense command configured to activate the antenna assembly from a low power sleep mode when a universal serial bus (USB) port voltage of a vehicle internal router is received by the antenna assembly.

2. The antenna assembly according to claim 1 wherein the plurality of antenna elements comprises at least one long term evolution (LTE) antenna element, at least one WiFi antenna element, and at least one Global Positioning System/Global Navigation Satellite System (GPS/GLONASS) antenna element.

3. The antenna assembly according to claim 1 further comprising a communication cable connected to the modem at one end and extending to and connected to the vehicle device at another end.

4. The antenna assembly according to claim 1 further comprising a thermal insulation pad attached to a bottom surface of the base.

5. The antenna assembly according to claim 1 wherein the sleep sense command is synchronized with a power mode of the vehicle device.

6. A wireless communication assembly for a vehicle, the wireless communication assembly comprising:
a base comprising an interior surface, a sidewall and a plurality of heat dissipation elements outward from the sidewall;
a modem disposed within the base;
an antenna assembly disposed within the base and comprising a plurality of antenna elements;
a housing for covering the base; and
a sleep sense command configured to activate the antenna assembly from a low power sleep mode when a universal serial bus (USB) port voltage of a vehicle internal router is received by the antenna assembly.

7. The wireless communication assembly according to claim 6 wherein the plurality of antenna elements comprises at least one long term evolution (LTE) antenna element, at least one WiFi antenna element, and at least one Global Positioning System/Global Navigation Satellite System (GPS/GLONASS) antenna element.

8. The wireless communication assembly according to claim 6 further comprising a communication cable connected to the modem at one end and extending to and connected to the vehicle device at another end.

9. The wireless communication assembly according to claim 6 further comprising a thermal insulation pad attached to a bottom surface of the base.

10. The wireless communication assembly according to claim 6 wherein the sleep sense command is synchronized with a power mode of the vehicle device.

11. A method for activating and deactivating a modem for an antenna assembly for a vehicle, the method comprising:
receiving an activation signal at a processor from an ignition input of the vehicle and a universal serial bus (USB) port voltage of a vehicle internal router when the modem of the antenna assembly is in a low power sleep mode;
activating the modem from the low power sleep mode;
receiving an input deactivation signal at the processor from the ignition input of the vehicle and the USB port voltage of the vehicle internal router, and deactivating the modem into the low power sleep mode.

12. The method according to claim 11 wherein the antenna assembly comprises
a base comprising an interior surface, a sidewall and a plurality of heat dissipation elements outward from the sidewall,
the modem disposed within the base,
an antenna board disposed within the base and comprising a plurality of antenna elements; and a housing for covering the base.

13. The method according to claim 12 wherein the plurality of antenna elements comprises at least one long term evolution (LTE) antenna element, at least one WiFi antenna element, and at least one Global Positioning System/Global Navigation Satellite System (GPS/GLONASS) antenna element.

* * * * *